(12) United States Patent
Kim

(10) Patent No.: US 6,987,408 B2
(45) Date of Patent: Jan. 17, 2006

(54) DIGITAL DELAY LOCKED LOOP AND CONTROL METHOD THEREOF

(75) Inventor: Kyung-Hoon Kim, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/745,745

(22) Filed: Dec. 23, 2003

(65) Prior Publication Data

US 2004/0217788 A1 Nov. 4, 2004

(30) Foreign Application Priority Data

May 30, 2003 (KR) .................... 10-2003-0034917

(51) Int. Cl.
*H03L 7/06* (2006.01)

(52) U.S. Cl. ............... 327/158; 327/159; 327/161
(58) Field of Classification Search .......... 327/156–162
See application file for complete search history.

(56) References Cited

U.S. PATENT DOCUMENTS

| | | | |
|---|---|---|---|
| 5,614,855 A | | 3/1997 | Lee et al. |
| 5,828,255 A | * | 10/1998 | Kelkar et al. ............ 327/157 |
| 6,037,812 A | | 3/2000 | Gaudet |
| 6,087,868 A | * | 7/2000 | Millar ................... 327/156 |
| 6,240,152 B1 | | 5/2001 | Ho |
| 6,815,990 B2 | * | 11/2004 | Lee ...................... 327/158 |
| 2001/0028266 A1 | | 10/2001 | Taniguchi |

FOREIGN PATENT DOCUMENTS

| | | |
|---|---|---|
| JP | 11-086545 | 3/1999 |
| KR | 1020000028629 A | 5/2000 |
| KR | 1020000056531 A | 9/2000 |

* cited by examiner

*Primary Examiner*—Timothy P. Callahan
*Assistant Examiner*—An T. Luu
(74) *Attorney, Agent, or Firm*—Blakely, Sokoloff, Taylor & Zafman

(57) ABSTRACT

There is provided a digital delay locked loop (DLL) which is capable of minimizing a jitter by predicting and detecting a maximum jitter timing. The digital delay locked loop includes: a clock generator for generating a source clock and a reference clock; a delay line provided with a plurality of unit delays, for delaying the source clock by a predetermined time; a delay model for reflecting a delay time of an actual internal circuit to an output of the delay line; a phase comparator for comparing a phase of the reference clock with a phase of a feedback clock outputted from the delay model; a jitter detector for detecting a maximum jitter timing in response to a phase comparison signal outputted from the phase comparator and generating a multi-delay enable signal; and a delay controller for controlling a delay amount of the delay line by unit-delay unit or multi-delay unit in response to the phase comparison signal and the multi-delay enable signal.

19 Claims, 13 Drawing Sheets

DIGITAL DELAY LOCKED LOOP AND CONTROL METHOD THEREOF

FIELD OF THE INVENTION

The present invention relates to a delay locked loop (DLL) for use in a semiconductor memory device, such as a double data rate (DDR) synchronous dynamic random access memory (SDRAM) or a single data rate (SDR) SDRAM; and, more particularly, to a DLL having an improvement in a jitter characteristic.

DESCRIPTION OF THE PRIOR ART

A delay locked loop (DLL) is a circuit that controls a timing of data, which is outputted out of a semiconductor memory device (e.g., an SDRAM) based on an external clock. Here, the external clock is a clock that is inputted from an outside of the semiconductor memory device. In order to transfer data to a chipset without any error, a clock of the SDRAM should be synchronized with that of the chipset.

The reason why the DLL is used in the SDRAM is that a phase is delayed while the external clock passes through an input clock buffer, a line loading, a data output buffer and other logic circuits, such that the phases of the external clock and the internal clock are mismatched.

The delayed phase due to an internal circuit of the SDRAM is called a "clock skew" and a DLL is a circuit for compensating the clock skew. The DLL serves to prevent an occurrence of a phase difference between a phase of an output data and the external clock. According to the DLL, a timing when the data sensed at an SDRAM core based on the external clock is outputted through a data output buffer is synchronized with a timing of an clock inputted from an external circuit.

The DLLs are classified into an analog DLL and a digital DLL, and the digital DLL also includes a register controlled DLL (hereinafter, referred to as an RC DLL), a hybrid DLL, a synchronous mirror DLL (hereinafter, referred to as an SM DLL), a measured controlled DLL (hereinafter, referred to as an MC DLL), and the like.

FIG. 1 is a block diagram of an RC DLL according to the related art.

Referring to FIG. 1, the RC DLL includes a clock generator 10, a phase comparator 11, a delay controller 12, a delay line 13, a clock signal line 14, an output buffer 15, and a delay model 16.

The clock generator 10 buffers an external clock eclk to generate source clocks rclk and fclk and a reference clock ref. The phase comparator 11 compares the reference clock ref with a phase of a feedback clock fb that is fed back through the delay model 16, and detects a phase difference between the reference clock REF and the feedback clock fb. The delay controller 12 includes a register and a delay selecting unit and controls a delay amount of the delay line 13 according to the result of the phase comparison. Under a control of the delay controller 12, the delay line 13 delays the output of the clock generator 10, i.e., the source clock rclk. The clock signal line 14 transfers an output of the delay line 13 to the output buffer 15. The output buffer 15 receives data from the core and outputs a data through an output terminal in synchronization with a clock of the clock signal line 14. The delay model 16 generates the feedback clock fb to the phase comparator 11 through a feedback loop. The feedback clock fb is obtained by modeling delay components from an input of the external clock eclk to the delay line 13 and until the output clock of the delay line 13 is outputted to an outside of the chip.

Hereinafter, an operation of the respective elements will be described in detail.

The clock generator 10 generates the source clocks rclk and fclk and the reference clock ref based on the external clock eclk. In other words, using the external clock eclk and external clock bar eclkb, the clock generator 10 generates the rising clock rclk, the falling clock fclk and the reference clock ref, which are used in an inside of the DLL.

FIG. 2 is an exemplary circuit diagram of the clock generator shown in FIG. 1.

Referring to FIG. 2, the external clock bar eclk and the external clock eclk are respectively inputted to gates of NMOS transistors N20 and N21 that are used as input terminals of a differential amplifier. An NMOS transistor N22 is connected between each source of the NMOS transistors N20 and N21 and a ground voltage terminal VSS. A gate of the NMOS transistor N22 is controlled by an enable signal.

Further, PMOS transistors P20 and P21 are provided between each drain of the NMOS transistors N20 and N21 and a power supply voltage terminal VDD. Gates of the PMOS transistors P20 and P21 are commonly connected to each other. An inverter I20 inverts a signal outputted from the drain of the NMOS transistor N21 to thereby output the clock signal CLK.

Additionally, the clock generator 10 can include a first clock generating unit for receiving the external clock and generating the rising clock rclk in synchronization with rising edges of the external clock, and a second clock generating unit for receiving the external clock bar eclkb and generating the falling clock fclk in synchronization with falling edges of the external clock, except for the differential amplifier. For the sake of simplicity, the first and second generating units are not shown in the drawing.

The phase comparator 11 compares the phase of the reference clock ref with the phase of the feedback clock fb and detects the phase difference between the two clocks. Generally, in order to reduce a power consumption of the DLL, a frequency of the clock inputted from an exterior is lowered through a divider.

Herein, the rising clock rclk is used as the reference clock without using the divider.

FIG. 3 is a detailed circuit diagram showing a part of the phase comparator and the delay controller according to the related art.

Referring to FIG. 3, the phase comparator includes an input confirmation pulse generating unit 110, a shift-left control signal generating unit 111, and a shift-right control signal generating unit 112.

The input confirmation pulse generating unit 110 receives the reference clock ref and the feedback clock fb, detects the inputs of the two clocks, and generates an input confirmation pulse cmp. The shift-left control signal generates a shift-left control signal lsh in response to a signal fbd, the reference clock fb and the input confirmation pulse cmp. Here, the signal fbd is a signal obtained by delaying the feedback clock fb by a unit time through a unit delay 113. The shift-right control signal generating unit 112 generates a shift-right control signal rsh in response to the feedback clock fb, the reference clock ref and the input confirmation pulse cmp.

Here, the unit delay 113 is provided with one inverter and one NAND gate and delays the feedback clock fb by the unit-delay time.

The shift-left control signal generating unit 111 and the shift-right control signal generating unit 112 have the symmetrical structure with each other and are configured with a plurality of cross-coupled NAND latches, NAND gates and inverters. Since the shift-left control signal generating unit 111 and the shift-right control signal generating unit 112 have the typical configuration, a detailed description about them will be omitted.

Further, a reference numeral "120" represents a shift register control signal generating unit contained in the delay controller.

The shift register control signal generating unit 120 is configured with a plurality of cross-coupled NAND latches, NAND gates and inverters.

The phase comparator 11 compares the reference clock ref with the phase of the feedback clock fb. The delay controller 12 is controlled according to a result of the comparison. Generally, the phase comparator 11 generates information, i.e., "lead", "lag" and "locking" of the feedback clock fb. The phase comparator 11 includes an additional block for controlling a shift operation of the shift register contained in the delay controller 12. The additional block is the shift register control signal generating unit 120 of FIG. 3.

The shift register control signal generating unit 120 receives the reference clock ref (specifically, a signal cmpb) and generates a shifting signal by using a function of T-flip flop.

The delay controller 12 is provided with a logic circuit for determining input paths of the shift register control signal generating unit 120 and the delay line 13, and a bi-directional shift register for changing position of the paths.

FIG. 4 is a detailed circuit diagram showing the shift register of the RC DLL according to the related art.

Referring to FIG. 4, the shift register is provided with a plurality of stages (m×n). Each stage includes: an inversion latch L consisting of a NAND gate NAND and an inverter INV; a switching unit S for changing a value latched in the latch L in response to shift signals sre, sro, sle and slo; and a logic combination unit C for logically combining a positive output of a latch contained in a previous stage and a negative output of a latch contained in a next stage.

Here, in the latch of each stage, the NAND gate has one input terminal receiving a reset signal resetz and the other input terminal receiving the negative output of the corresponding latch L in order for an initialization.

The switching unit S includes: an NMOS transistor M1 connected to the positive output terminal of the latch L and controlled by an odd shift right signal sro; an NMOS transistor M2 connected to the negative output terminal of the latch L and controlled by an even shift left signal sle; and an NMOS transistor M4 controlled by the negative output of the latch L contained in the previous stage, for selectively forming a path between the positive output terminal and the ground voltage terminal together with the NMOS transistor M1.

Meanwhile, the previous stage and the next stage are controlled by the even shift right signal sre and the odd shift left signal slo among the shift signals sre, sro, sle and slo.

The logic combination unit C is provided with an OR gate configured to receive the positive output of the previous stage and the negative output of the next stage.

In other words, the shift register receives four input signals sre, sro, sle and slo and performs a shifting operation. An initial input condition can allow the shift register to have initially max/min delay. The signals inputted to the shift register are two shift right signals sre and sro and two shift left signals sle and slo.

FIG. 5 is a detailed circuit diagram showing the delay line of the RC DLL according to the related art.

The delay line 13 is a circuit for delaying the phase of the external clock. At this point, a degree of the phase delay is determined by the phase comparator 11 and forms the delay path that determines the phase delay under a control of the delay controller 12. The delay line 13 is provided with a plurality of unit-delay elements having an NAND gate and an inverter. An input of each unit delay is connected to the shift register by 1:1 and a position where the output terminal of the shift register becomes a logic high is determined as a path to which the reference clock is inputted.

A detailed description about the delay line will be made with reference to FIG. 5.

Referring to FIG. 5, the delay line includes NAND gates NAND1, . . . , NANDm−1, NANDm, NANDm+1, . . . , NANDm*n configured to receive an input clock clk_in and delay select signals sel_1, . . . sel_m−1, sel_m+1, . . . , sel_m*n, and the m*n number of unit delays DU1, . . . , DUm−1, DUm, DUm+1, . . . , DUm*n controlled by the outputs of the NAND gates.

Here, each unit delay consists of two NAND gates. For example, the m-th unit delay DUm includes: a first NAND gate NAND100 configured to receive an output of the previous unit delay DUm−1 and an output of the corresponding NAND gate NANDm; and a second NAND gate NAND101 configured to receive a power supply voltage VDD and an output of the first NAND gate NAND100. At this point, since there is no unit delay before the first unit delay DU1, the first unit delay UD1 receives the power supply voltage VDD instead of an output of the previous unit delay.

The delay model 16 is a modeling of delay elements before an external clock passes through the delay line 13 and until an output clock of the delay line 13 is outputted to an outside of the chip. The correct delay elements determine the skew value among the DLL performances. The delay model 16 is provided by shrinking or simplifying a basic circuit, or by using a basic circuit itself. In practice, the delay model 16 models the clock generator 10, the DLL clock divider, a divider R/F and the output buffer 15.

FIG. 6 is a timing chart of a DLL latency in case no power noise exists, and FIG. 7 is a timing chart of a DLL latency in case a power noise exists.

Hereinafter, an overall operation of the DLL and a problem according to the DLL latency will be described with reference to FIGS. 1 to 7.

As described above, the DLL is a circuit for synchronizing the phases between the external clock and the internal clock. In order to synchronize the phases of the two clocks, the phase comparator continuously compares the two clocks, i.e., the reference clock ref and the feedback clock fb. The phase comparator 11 provides an information to the delay controller based on the phase information of the reference clock ref and the feedback clock fb. The delay line 13 is controlled by the information to decrease the phase difference.

The input clock must pass through the phase comparator 11 and the delay controller 12 until a path of the delay line 13 must be changed because of the phase difference between the internal clock and the external clock. If the input clock of the delay line, i.e., the output of the delay controller 12, lags behind the desired phase at a "timing 1" of FIG. 6, the input clock is inputted to the phase comparator 11 after a predefined delay (the input clock passes the delay line and the delay model).

The timing when the clock is inputted to the phase comparator 11 is a "timing 2" which is later than the "timing 1". The result of the phase comparison at the "timing 2" is provided to the delay controller 12, so that a predetermined time is also taken until the path of the delay line is adjusted. Therefore, a timing when the delay value of the delay line 13 is changed is a "timing 3" after a predetermined time elapses from the "timing 2".

For these reasons, as shown in FIG. 6, the DLL has a latency for compensating the phase internally.

Under a situation that noise is not considered in the DLL, a state error (i.e., skew) exists as much as a resolution of the unit delay. In this situation, the latency inside the DLL is not an important problem.

Like this, the DLL latency is not a serious problem in an ideal operation environment. However, the DLL will have a skew by the delay of the unit delay if the delay model 16 is ideal.

Several noise components occur in the operation of the DLL. Due to these noise components, the delay amount of the delay line 13 and the delay model 16 are varied and the phase difference between the external clock and the internal clock occur. An irregular phase difference occurring at that time is referred to as a "jitter".

The jitter component can be reduced through the successive phase comparison operations of the DLL after the DLL locking (the delay locked state). However, since the internal latency of the DLL still exits, it is possible to eliminate the jitter component at an accurate timing.

As described above, in case the phase of the clock is compensated since the delay value is changed due to an addition of a power noise to the delay line 13 at the "timing 1", the compensation timing is the "timing 3" after a predetermined time elapses. However, the clock phase variation at the "timing 3" cannot be known since it is difficult to predict the power noise value that, affects the delay line 13 at the actual "timing 3". Meanwhile, the predictable situation is that the power supply of the delay line 13 increases a voltage due to the power noise to thereby cause the phase of the clock to be leaded. In case the power noise value lowers the power supply voltage, a worst jitter value is caused (refer to FIG. 7).

The reason is that the fed-back result of the phase comparator 11 due to the "timing 1" increases the path of the delay line 13. Under these situations, in case the power supply voltage is lowered to increase the unit-delay unit, the maximum jitter occurs. Of course, the case the power supply voltage is lowered at the "timing 1" and increased at the "timing 3" is also the same.

Specifically, in the system, such as SDRAM, in which data is transmitted in synchronization with the clock, a peak-to-peak jitter is most important. As a result, the worst jitter may cause the SDRAM to operate erroneously.

FIG. 7 is a timing chart of the DLL latency in case a power noise exists, in which the power supply voltage VDD is lowered due to the power noise and then finds its level.

If the power supply voltage VDD is lowered, the delays of the delay line and the delay model have reverse delay variations. The delay variation affects the phase comparator after a predetermined time.

It is shown in the delay variation occurring in the phase comparator in FIG. 7. The variation of the delay value due to the power noise can be seen after a short time in the phase comparator. The phase comparator applies a feedback to the delay line with the latency show in FIG. 6 based on the delay variation. The above DLL has the greatest jitter at a timing when the power is changed due to the latency.

SUMMARY OF THE INVENTION

It is, therefore, a primary object of the present invention to provide a digital delay locked loop and a method for controlling the same, which is capable of minimizing a jitter by predicting and detecting a timing when a maximum jitter occurs.

In accordance with the present invention, there is provided a digital delay locked loop (DLL) comprising: a clock generating means for generating a source clock and a reference clock; a delay line provided with a plurality of unit delays, for delaying the source clock by a predetermined time; a delay model for reflecting a delay time of an actual internal circuit to an output of the delay line; a phase comparing means for comparing a phase of the reference clock with a phase of a feedback clock outputted from the delay model; a jitter detecting means for detecting a maximum jitter timing in response to a phase comparison signal outputted from the phase comparing means and generating a multi-delay enable signal; and a delay control means for controlling a delay amount of the delay line by unit-delay unit or multi-delay unit in response to the phase comparison signal and the multi-delay enable signal.

In accordance with another aspect of the present invention, there is provided a method for controlling a digital delay locked loop, comprising the steps of: comparing a phase of a reference clock with a phase of a feedback clock, the feedback clock being outputted from a delay model; detecting a maximum jitter timing according to a result of the phase comparison; and controlling a delay amount of a delay line by multi-delay unit according to the detection of the maximum jitter timing.

In the present invention, a following algorithm is applied for minimizing a jitter in case a delay is varied due to a noise occurring inside a DLL, for example, a power noise having a constant period.

After a delay locking time of 200 cycles (a maximum allowable cycle of SDRAM), if the DLL directs a successive increase (or decrease) of a delay line during a predetermined time due to a power noise, the delay line is controlled by one state unit in order to decrease (or increase) the delay line for the purpose of avoiding the maximum jitter period. In other words, the delay line is controlled by multi unit of two or more stages.

After the delay locking, the maximum jitter occurs due to the latency of the internal DLL at a timing when the delay of the phase comparison signal is decreased (or increased) for more than the predetermined time after the delay of the phase comparison signal is increased (or decreased). The timing when the jitter becomes maximum is detected and the delay line is controlled by multi-delay unit.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Hereinafter, the preferred embodiments of the present invention will be described in detail with reference to the accompanying drawings.

Figure 8:
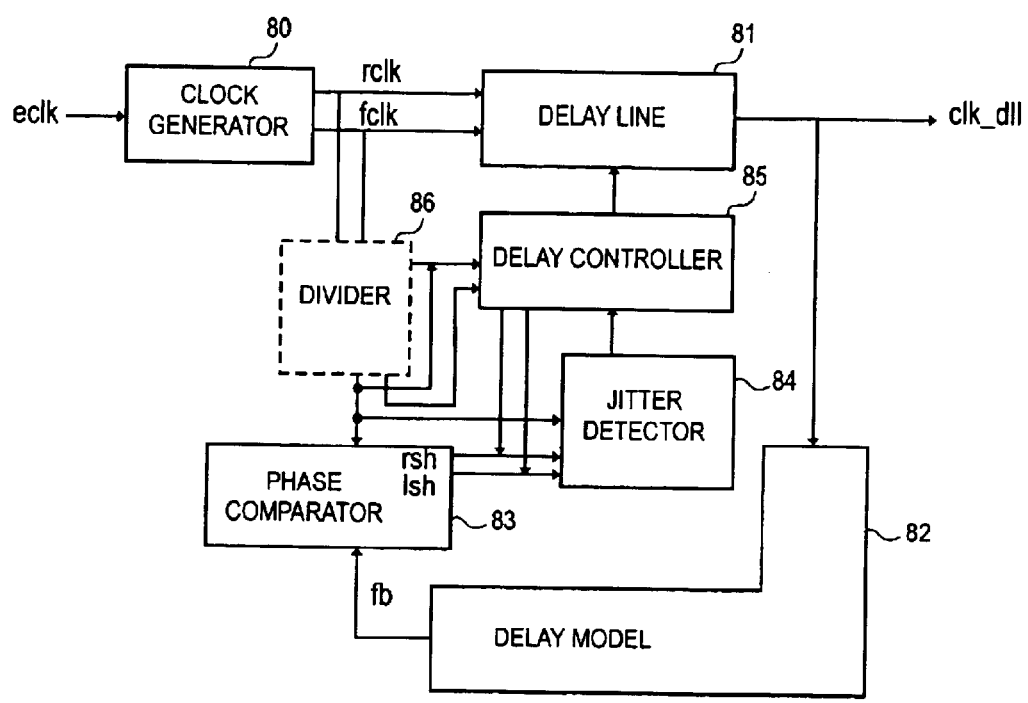
FIG. 8 is a block diagram of a digital DLL in accordance with an embodiment of the present invention.

FIG. 8 is a block diagram of a digital DLL in accordance with an embodiment of the present invention.

Referring to FIG. 8, the DLL of the present invention includes: a clock generator 80 for receiving an external clock eclk to generate source clocks rclk and fclk and a reference clock ref; a delay line 81 provided with a plurality of unit delay for delaying the source clocks rclk and fclk for a predetermined time; a delay model 82 for reflecting a delay time of an actual internal circuit to an output clk_dll of the delay line 81; a phase comparator 83 for comparing the reference clock ref with a feedback clock fb outputted from the delay model 82; a jitter detector 84 for detecting a maximum jitter time point and generating a multi-delay enable signal en in response to phase comparison signals lsh and rsh; and a delay controller 85 for controlling a delay amount of the delay line 81 by using a unit-delay or multi-delay unit in response to the phase comparison signals lsh and rsh and the multi-delay enable signal en.

Here, after the delay locking, the jitter detector 84 activates the multi-delay enable signal en when the phase comparison signals rsh and lsh maintain one state of a lag or a lead to at least N bits (N is a positive integer) and its state is changed. Meanwhile, the delay controller 85 controls the delay amount of the delay line 83 by multi-delay unit in response to the multi-delay enable signal en.

The clock generator 80 generates the source clocks synchronized with the external clock eclk. The source clocks includes the rising clock rclk synchronized with the rising edges of the external clock eclk and the falling clock fclk synchronized with the falling edges of the external clock fclk.

Here, a divider 86 for diving the rising clock rclk and the falling clock fclk is represented with a dotted line. The reference clock ref may be provided by dividing the rising clock rclk by the divider 86, or may be identical to the rising clock rclk.

Hereinafter, the embodiment using no divider will be described. The driver 86 is used is used in order to reduce the current consumption. Since its structure is typical, a description about that will be omitted.

The output of the delay line 81 is transferred to an output buffer (not shown) through a clock signal line (not shown). The output buffer receives data from a core and outputs data through an output terminal in synchronization with a clock of the clock signal line.

The delay model 82 performs a modeling to delay elements from an input of the external clock eclk to the delay line 81 and until the output clock clk_dll of the delay line 81 is outputted out of the chip, and provides the feedback clock fb to the phase comparator 83 through a feedback loop.

Figure 9:
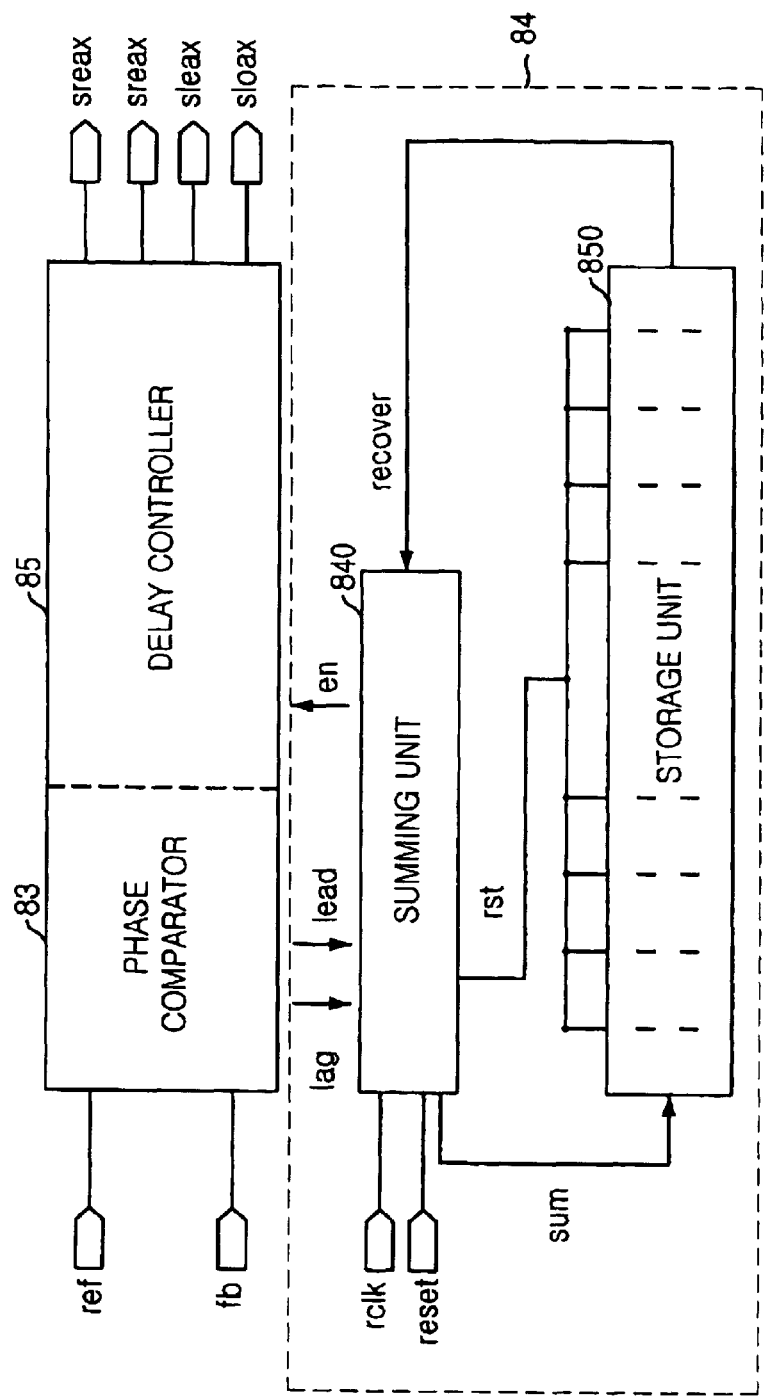
FIG. 9 is a block diagram illustrating a phase comparator and a jitter detector in accordance with an embodiment of the present invention.

FIG. 9 is a detailed block diagram of the phase comparator and the jitter detector.

Referring to FIG. 9, the jitter detector 84 includes a summing unit 840 for logically summing bit values corresponding to lead or lag of the phase comparison signal, and a N-bit storage unit 850 for storing the output of the summing unit 840 by bit unit. If the phase comparison signal maintains a state identical to one of the lead or the lag during N bits, the storage unit 850 provides a recovering signal to the summing unit 840. At a timing when the output state of the phase comparator 83 is changed, the summing unit 840 provides the multi-delay enable signal en to a delay controller 85 in response to the recovering signal.

Meanwhile, the summing unit 840 stores the summed phase comparison signal to the storage unit 850 by bit unit. If the state of the phase comparison signal is changed before it reaches N bits, the summing unit 840 outputs a reset signal rst to reset the storage unit 850. Herein, the storage unit 850 is exemplarily provided with an N-bit shift register.

Figure 10:
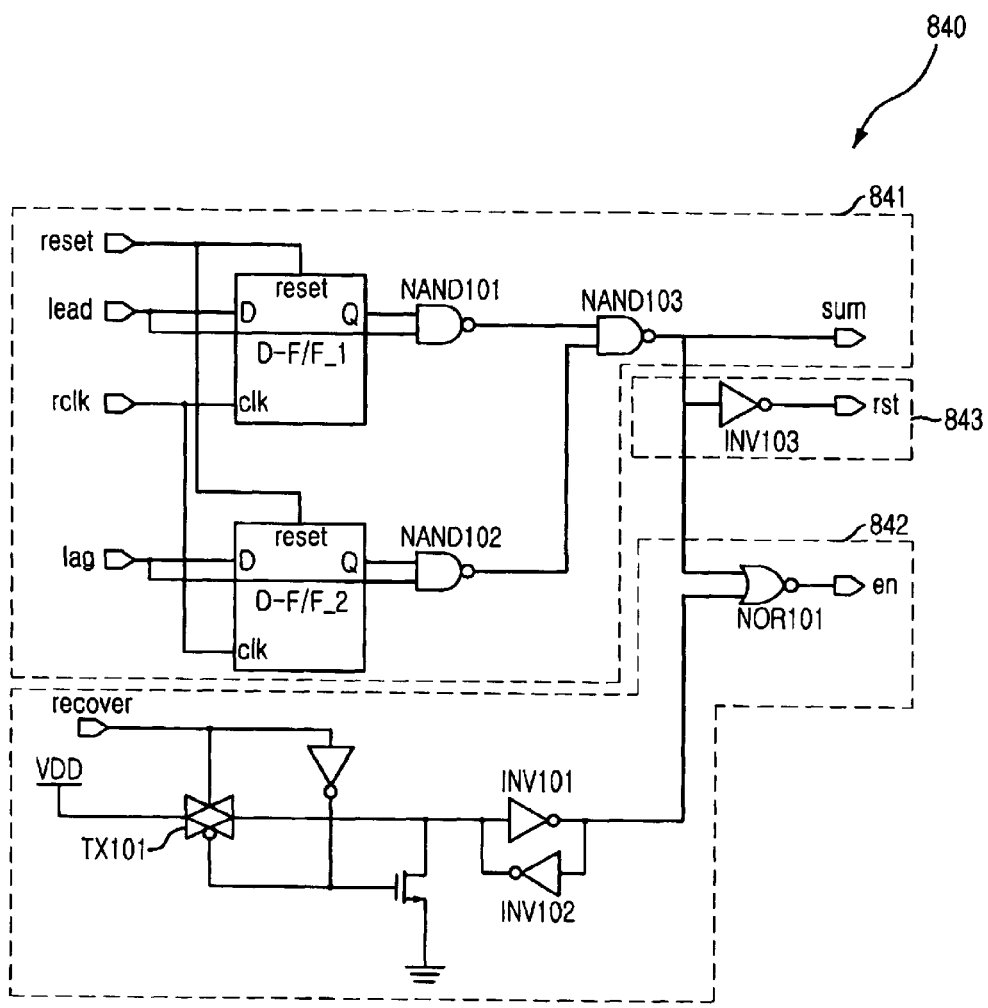
FIG. 10 is a detailed circuit diagram of a summing unit in accordance with an embodiment of the present invention.

FIG. 10 is a detailed circuit diagram of the summing unit 840 shown in FIG. 9.

Referring to FIG. 10, the summing unit 840 includes: a summing operation unit 841 for logically operating the lead and lag states of the phase comparison signal to output a summed phase comparison signal sum; a multi-delay enable signal generator 842 for outputting the multi-delay enable signal en in response to the recovering signal; and a reset signal generator 843 for receiving the summed phase comparison signal sum to output the reset signal rst for resetting the storage unit 850.

In more detail, the summing operation unit 841 includes: a first D-flip flop D-F/F_1 configured to receive the lead state of the phase comparison signal; a second D-flip flop D-F/F_2 configured to receive the lag state of the phase comparison signal; a first NAND gate NAND101 for NANDing the lead state of the phase comparison signal and the output of the first D-flip flop D-F/F_1; a second NAND gate NAND102 for NANDing the lag state of the phase comparison signal and the output of the second D-flip flop D-F/F_2; and a third NAND gate NAND103 for NANDing the outputs of the first and second D-flip flop D-F/F_1 and D-F/F_2 to output the summed phase comparison signal sum.

The multi-delay enable signal generator 842 includes: a transmission gate TX101 for transmitting a voltage level of the power supply voltage terminal VDD in response to the recovering signal recover; a first inverter INV101 for inverting an output of the transmission gate TX101; a second inverter INV102 configuring a latch together with the first inverter IINV101; and a NOR gate NOR101 for NORing the summed phase comparison signal sum and an output of the first inverter INV101 to output the multi-delay enable signal en.

The reset signal generator 843 is provided with a third inverter INV103 for inverting the summed phase comparison signal sum to output the reset signal rst.

Figure 11:
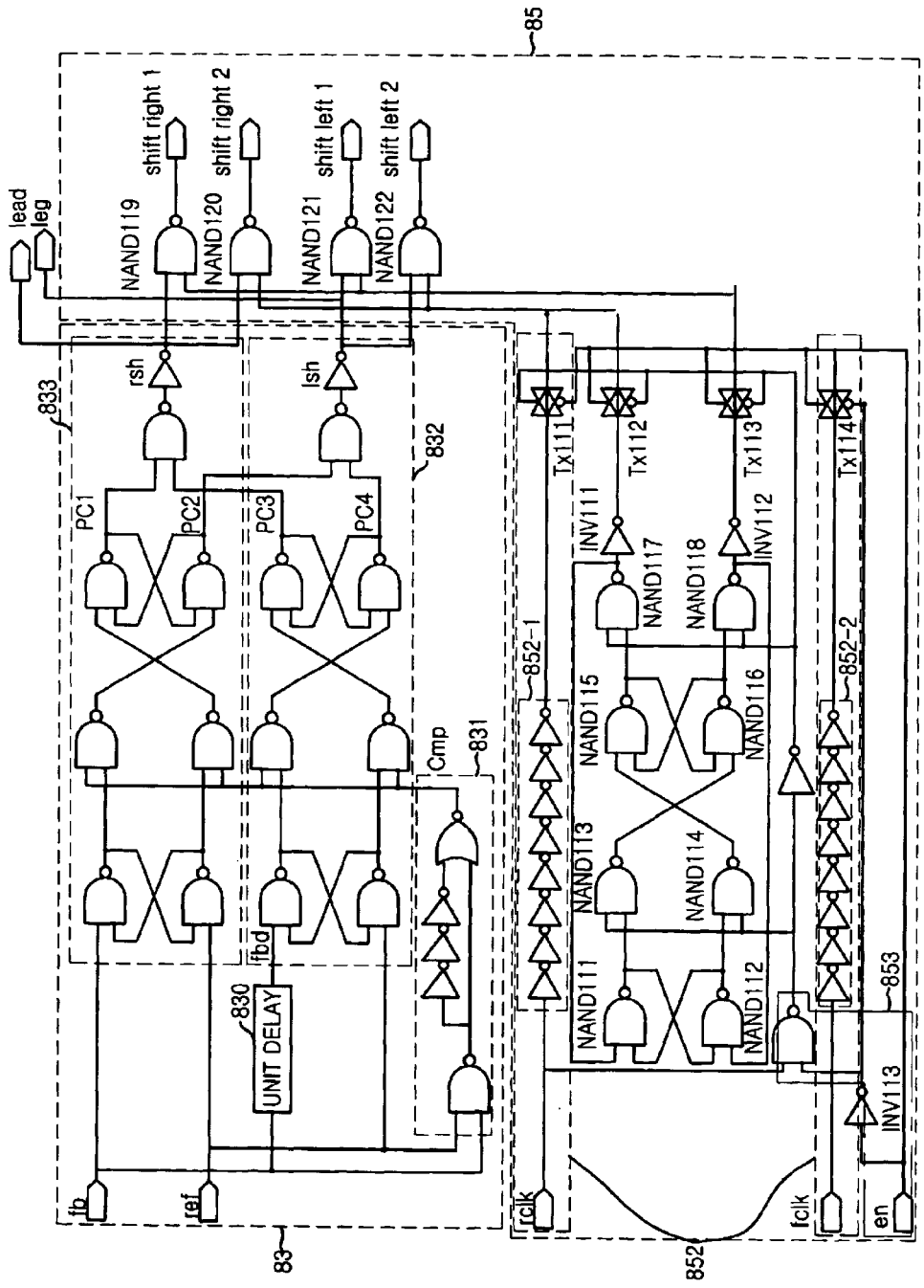
FIG. 11 is a detailed circuit diagram illustrating a phase comparator and a delay controller in accordance with an embodiment of the present invention.

FIG. 11 is a detailed circuit diagram illustrating a part of the phase comparator and the delay controller in accordance with an embodiment of the present invention.

Herein, the register control (RC) DLL among the digital DLLs will be described as an example.

Referring to FIG. 11, the phase comparator 83 includes an input confirmation pulse generating unit 831, a shift left control signal generating unit 832, and a shift right control signal generating unit 833.

The input confirmation pulse generating unit 831 receives the reference clock ref and the feedback clock fb and detects the inputs of the two clocks ref and fb to generate an input confirmation pulse cmp.

The shift left control signal generating unit 832 generates a shift left control signal lsh in response to a unit-time delayed signal fbd of the feedback clock fb, the reference clock ref and the input confirmation pulse cmp. Here, the unit-time delayed signal fbd is a signal obtained by delaying the feedback clock fb by unit time by means of a unit delay 830.

The shift right control signal generating unit 833 generates a shift right control signal rsh in response to the feedback clock fb, the reference clock ref and the input confirmation pulse cmp.

Here, the unit delay 830 is provided with one inverter and one NAND gate in order to delay the feedback clock fb by unit time.

The shift left control signal generating unit 832 and the shift right control signal generating unit 833 are symmetrical to each other and provides with a plurality of cross-coupled NAND latches, a NAND gate and an inverter. Since the structure is typical, a detailed description about that will be omitted.

As described above, the RC DLL is provide as an embodiment of the present invention and a reference numeral "85" is actually the shift register control signal generating unit contained in the delay controller.

In other words, the typical delay unit includes a shift register control signal generating, unit and a delay selecting unit for selecting a delay line in response to delay signals shift right1, shift right2, shift left 1 and shift left 2, which are outputted from the shift register control signal generating unit. Accordingly, the RC DLL includes the shift register and other digital DLL may use a counter.

Since structures of the shift register and the counter are typical, a description about them will be omitted.

Referring to FIG. 11, the delay controller 85 includes: a unit-delay control unit 851 for controlling the phase comparison signals rsh and lsh by unit-delay unit; a multi-delay controlling unit 852 for controlling the phase comparison signals rsh and lsh by multi-delay unit in response to the rising clock rclk and the falling clock fclk; a switching unit 853 for selecting switching on/off the unit-delay controlling unit 851 and the multi-delay control unit 852 in response to the multi-delay enable signal en; and a logic operation unit 854 for decoding the phase comparison signals rsh and lsh in response to the outputs of the unit-delay unit 851 and the multi-delay control unit 852 to output a plurality of delay signals shift right1, shift right2, shift left1 and shift left2.

In more detail, the unit-delay control unit 851 includes a plurality of T-flip flops configured with NAND gates NAND111 to NAND118, two inverters INV111 and INV112, and two transmission gates TX112 and TX113. The multi-delay control unit 852 includes delay chains 852_1 and 852_2 for respectively delaying the rising clock rclk and the falling clock fclk to allow them to have delay times corresponding to the delay times of the T-flip flops, and two transmission gates TX112 and TX113.

The logic operation unit 854 is provided with four NAND gates NAND119 to NAND 122 for outputting the delay signals shift right1, shift right2, shift left 1 and shift left 2, respectively.

The switching unit 853 includes an inverter INV113 for inverting the multi-delay enable signal en, and a NAND gate NAND123 for NANDing an output of the inverter INV113 and the rising clock rclk. An output of the NAND gate NAND123 is inverted by an inverter INV114 and applied to the T-flip flop.

Figure 12:
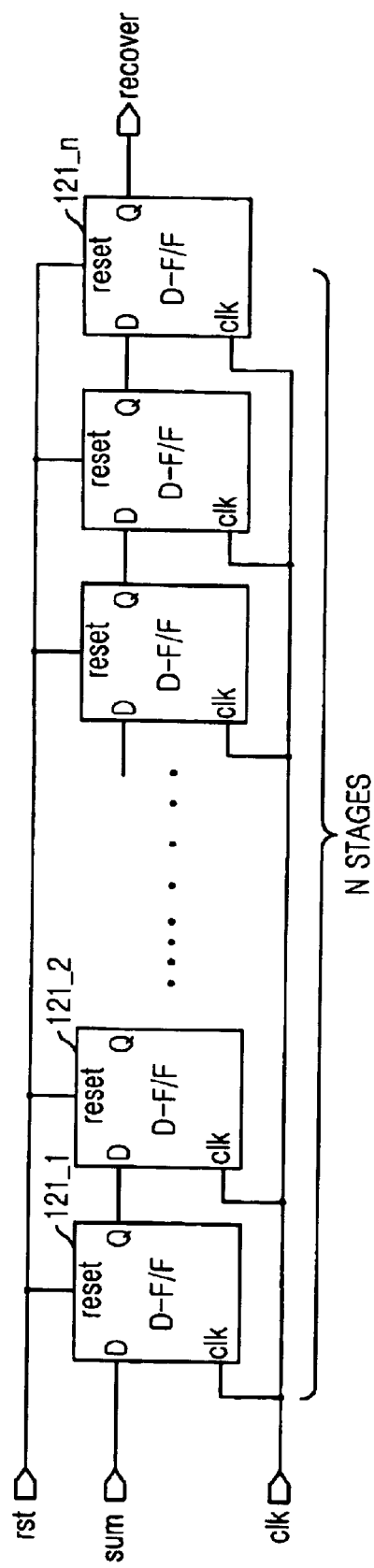
FIG. 12 is a detailed circuit diagram illustrating a storage unit of a jitter detector in accordance with an embodiment of the present invention, in which the storage unit is provided with N-bit shift registers.

FIG. 12 is a detailed circuit diagram illustrating the storage unit of the jitter detector configured with the N-bit shift register.

Referring to FIG. 12, the N-bit shift register is provided with N stages and includes the N number of serially-connected D-flip flops 121_1 to 121_n. The N-bit shift register receives the summed phase comparison signal sum and outputs the recovering signal "recover" through the N-th D-flip flop 121n.

Additionally, the respective D-flip flops 121_1 to 121_n are reset by the reset signal rst if the lead or lag states are not maintained during N bits.

Figure 1:
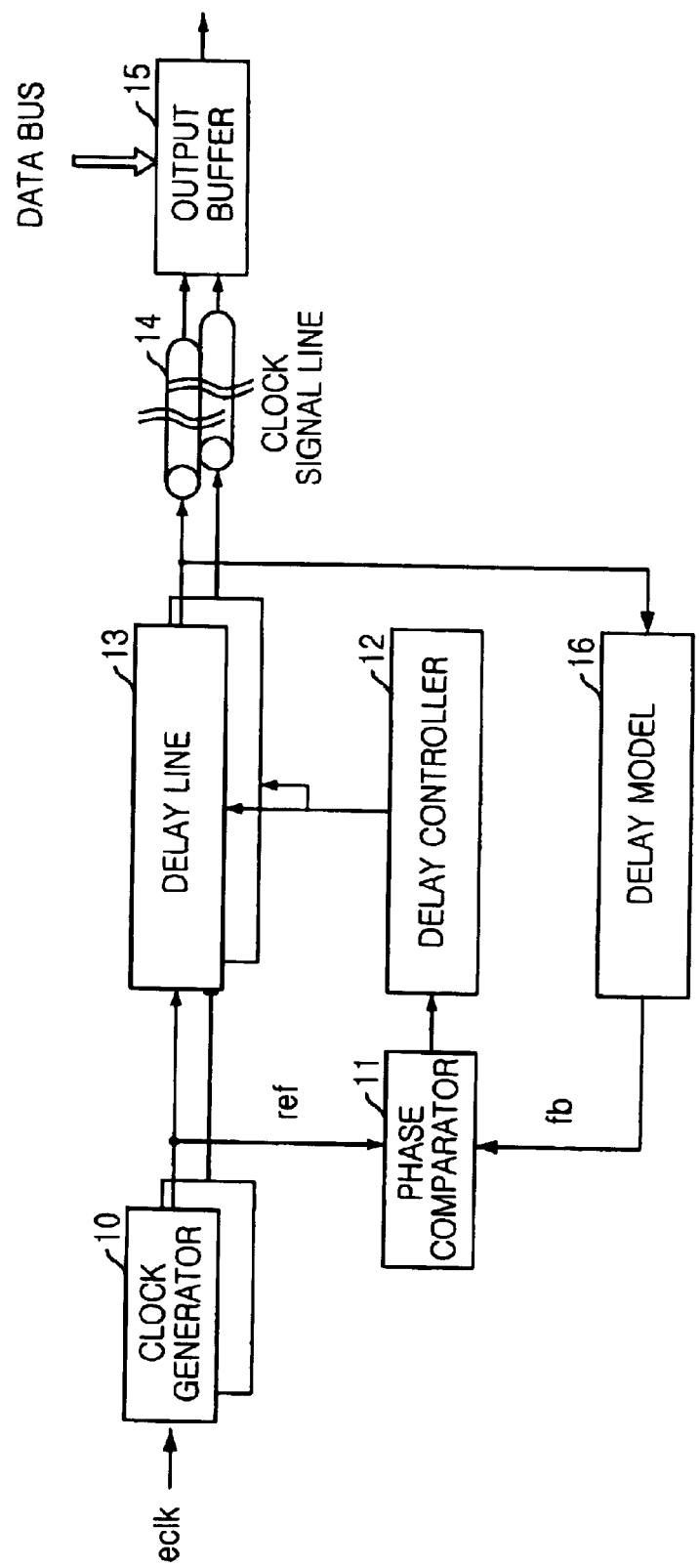
FIG. 1 is a block diagram of an RC DLL according to the related art.
Figure 2:
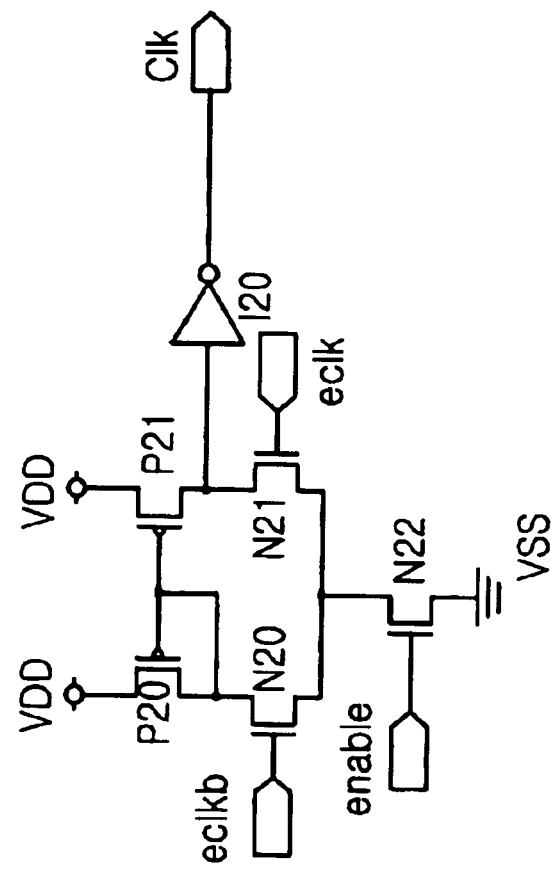
FIG. 2 is a detailed circuit diagram of a clock generator shown in FIG. 1.
Figure 3:
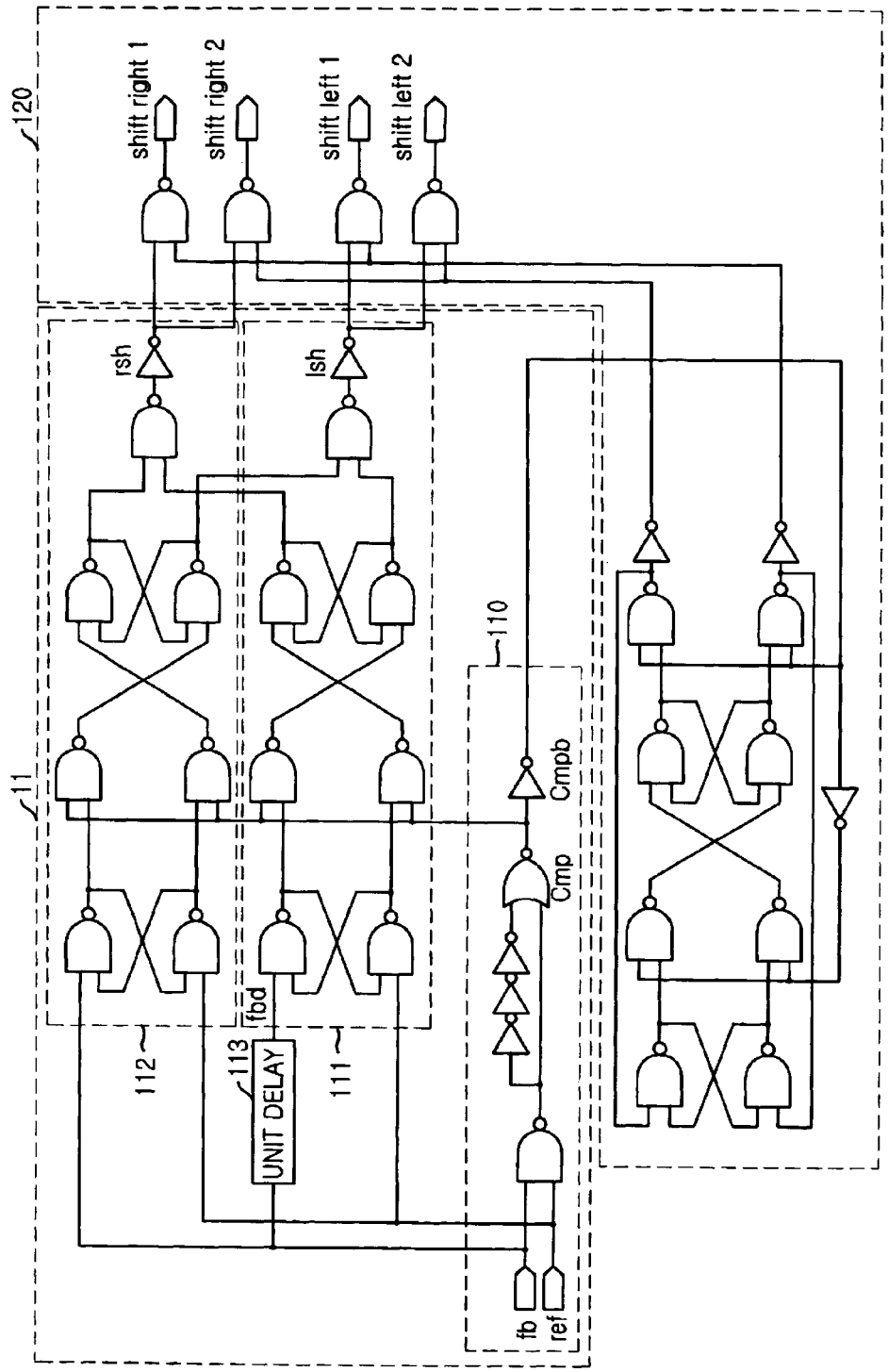
FIG. 3 is a detailed circuit showing a phase comparator and a delay controller according to the related art.
Figure 4:
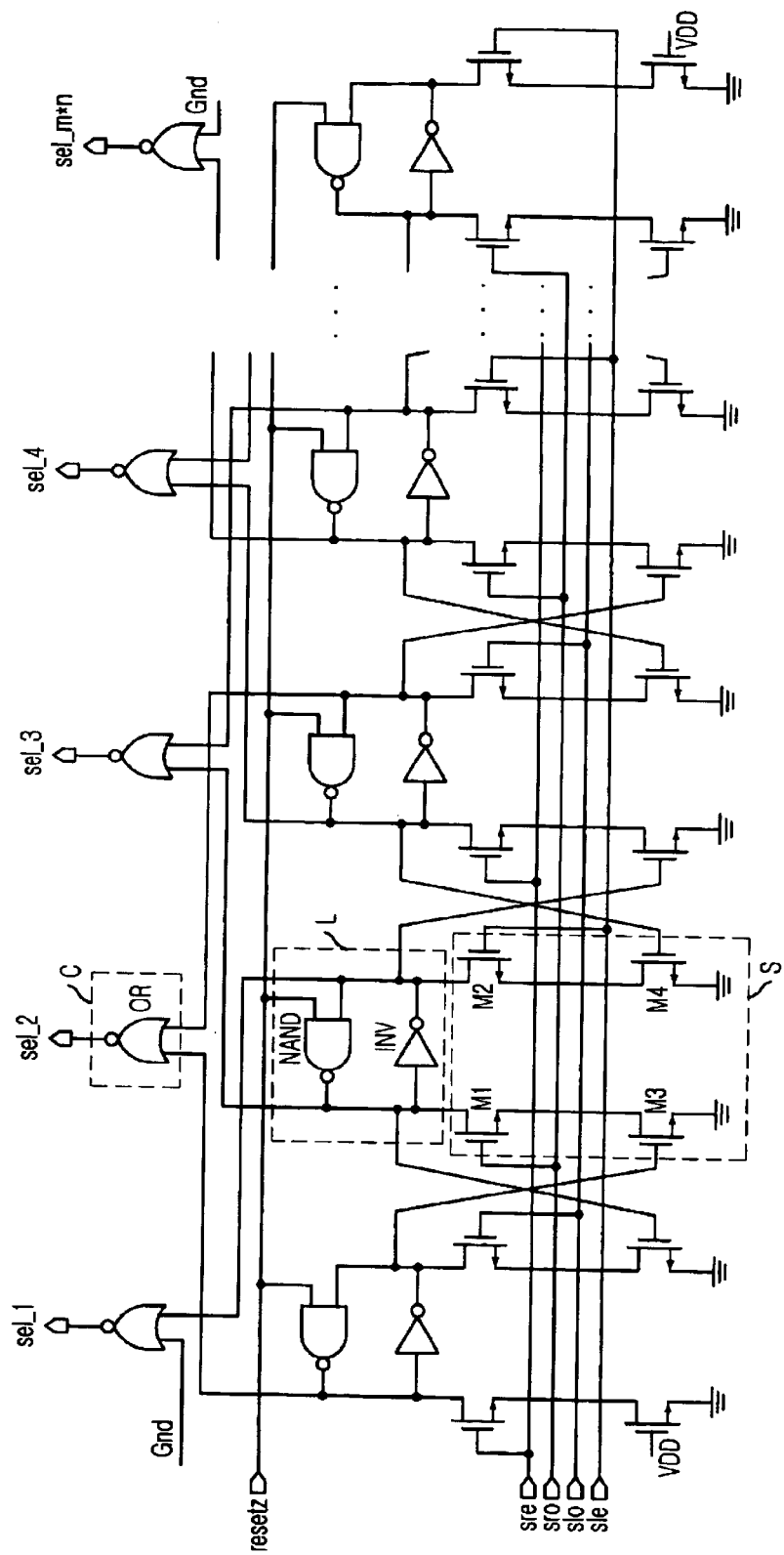
FIG. 4 is a detailed circuit diagram showing a shift register of an RC DLL according to the related art.
Figure 5:
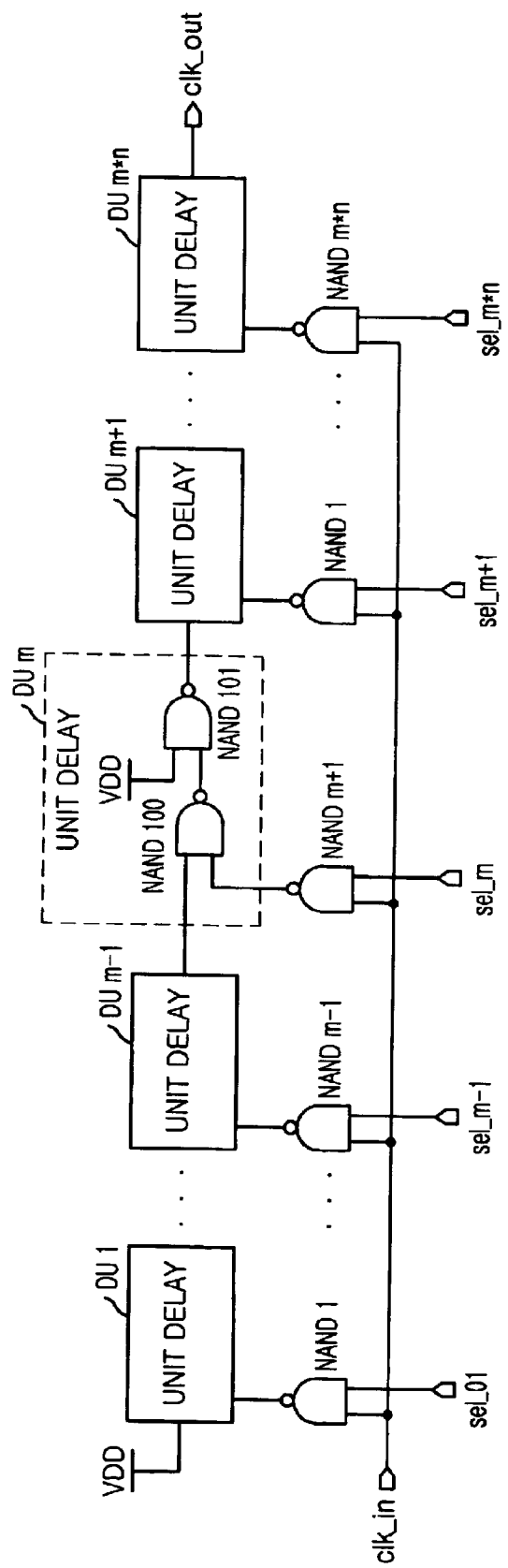
FIG. 5 is a detailed circuit diagram showing a delay line of an RC DLL according to the related art.
Figure 6:
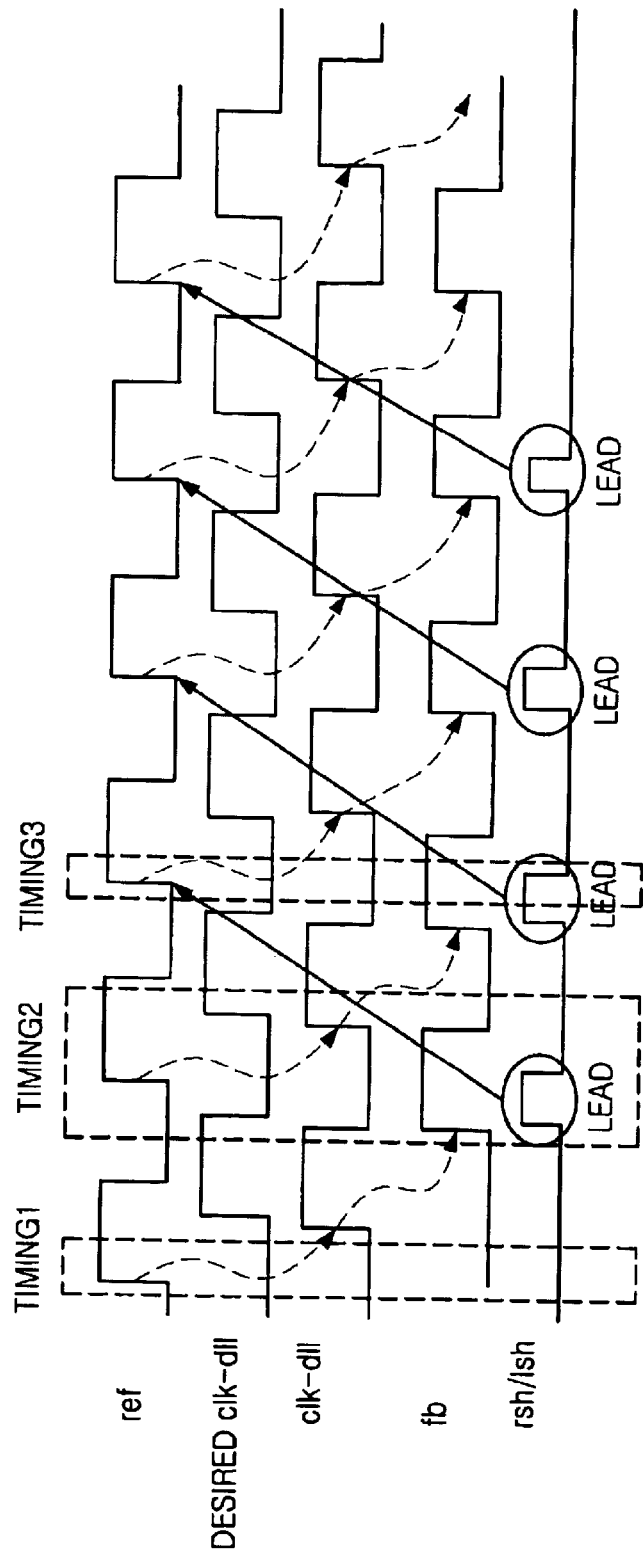
FIG. 6 is a timing chart of a DLL latency in case no power noise exists.
Figure 7:
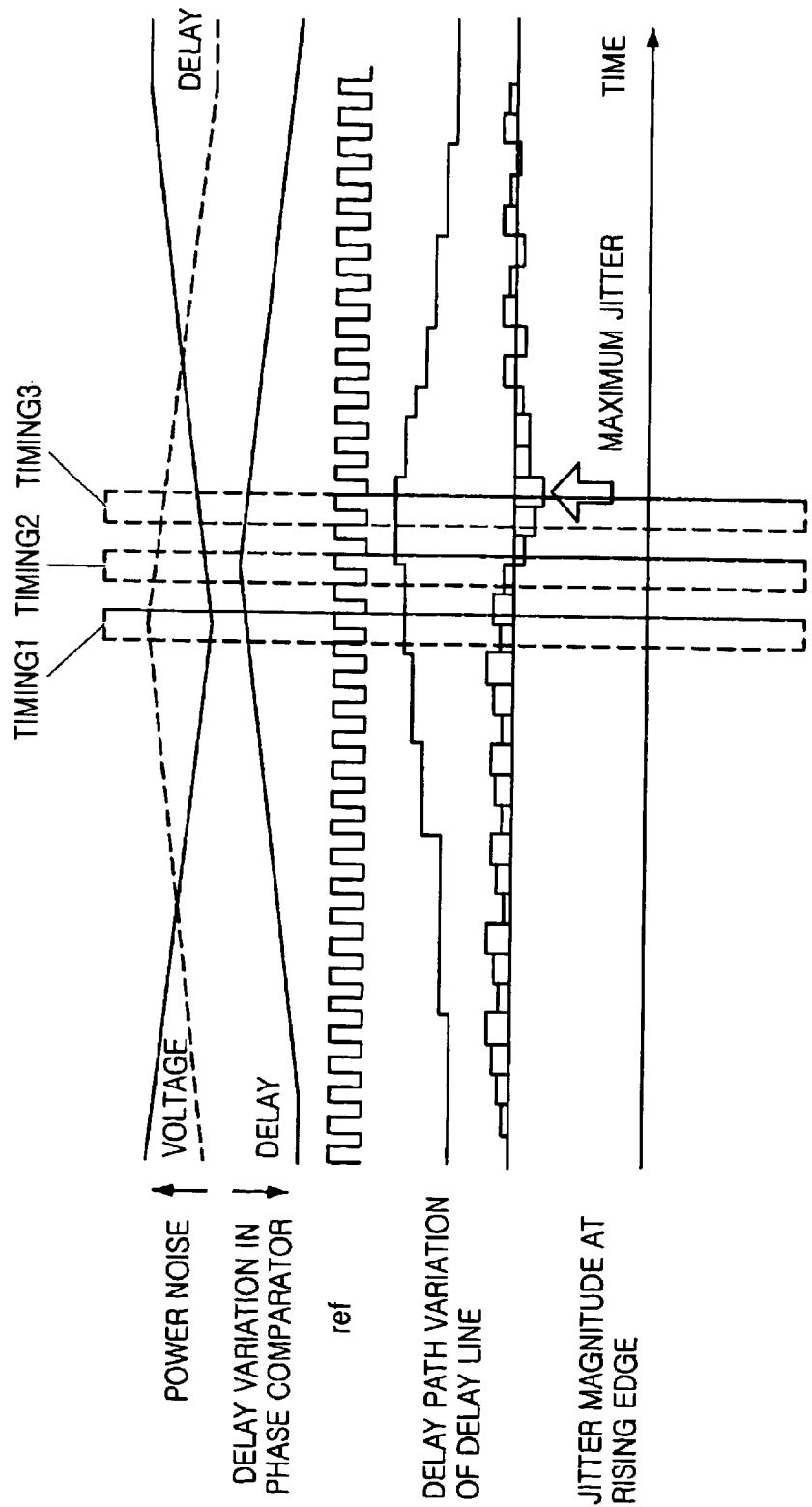
FIG. 7 is a timing chart of a DLL latency in case a power noise exists.

Hereinafter, an operation of the digital DLL will be described in detail with reference to FIGS. 7 to 9.

The phase comparator 83 compares the feedback clock fb and the reference clock ref. Here, the feedback clock fb is a clock that is fed back through the delay line 81 and the delay model 82 and the reference clock ref is a clock that is generated from the clock generator 80. The DLL becomes a delay locked state after 200 cycles. If there is no component including power noise and the like, the DLL maintains the locked state.

In this embodiment of the present invention, main factors causing the jitter are noise having a constant period, specifically a power noise.

If the power noise is applied, the delay value is changed in the delay line 81 and the delay model 82. Therefore, the delay time of the feedback clock fb is mismatched, thus breaking the locked state.

The DLL tracks the changing delay value. At this time, if the power noise having a constant period is applied, a jitter having a constant pattern is generated. This results in a delay variation of constant pattern in the delay line 81 and the delay model 82. Additionally, the DLL changes the delay by controlling the delay line 81 with a constant pattern.

At this time, the value compared in the phase comparator 83 changes a value of the jitter under the same power noise environment according to a value of a latency fed back to the delay line 81.

If the value of the latency is equal to or smaller than a period of the power noise, a situation showing the greatest jitter is the case that the power noise increases and then decreases to thereby decrease and then increase the delay value, and vice versa.

As described above, this can be seen from FIG. 7.

If the multi-bit (e.g., 2-bit) shifting operation is performed at a timing when the leading and lagging states between the reference clock ref and the feedback clock fb are changed in the phase comparator 83, the DLL's maximum jitter due to the power noise can be reduced.

The jitter detector 84 operates in response to the comparison result of the phase comparator 83. As the comparison result, if the reference clock ref and the feedback clock fb continue to maintain the leading or the lagging state during N periods, the jitter detector 84 outputs the recovering signal "recover" for controlling the delay amount of the delay line 81 by multi-delay unit.

Then, if the leading or lagging states of the two clocks ref and fb are changed reversely, the phase comparator 83 causes the delay controller 85 to be multi-shifted at that timing.

If the phase comparator 83 outputs the constant result during N periods (N bits), the phase comparator 83 resets the data stored in the N-bit storage unit 850. After the reset operation, the jitter detector 84 continues to monitor the comparison result of the phase comparator 83.

On the contrary, if the phase comparator 83 outputs the constant result even after the N periods, the phase comparator 83 causes the delay controller 85 to be multi-shifted.

Hereinafter, a detailed circuit operation will be described with reference to FIGS. 10 to 12.

After the DLL locking, the constant lead or lag signals of the phase comparator 83 are changed to a high state by the summing unit 840 of FIG. 10 and then stored in the storage unit 850. In this case, the result of the phase comparator 83 must be constant successively.

If the constant lead or lag state is maintained by the phase comparator 83, the data of high state are continuously inputted to the N-bit storage unit 850. If the last data of high state is inputted, the recovering signal "recover" is activated to the high state.

If the recovering signal "recover" is activated, the transmission gate TX101 of the multi-delay enable signal generating unit 842 is closed, so that the high state is inputted to the latch consisting of the inverters INV101 and INV102. As the comparison result of the phase comparator 83, if the state different from the previous state is outputted (i.e., lag→lead, lead→lag), two inputs of the NOR gate NOR101 are all set to low states, so that the multi-delay enable signal en is activated to a high state.

If the multi-delay enable signal en is activated, the unit-delay control unit 851 containing T-flip flop does not operate, but the multi-delay control unit 852 using both the rising clock rclk and the falling clock fclk operates.

Since the duty ratios of the rising clock rclk and the falling clock fclk are not 50:50, an overlapped section of the two clocks rclk and fclk does not occur.

Figure 13:
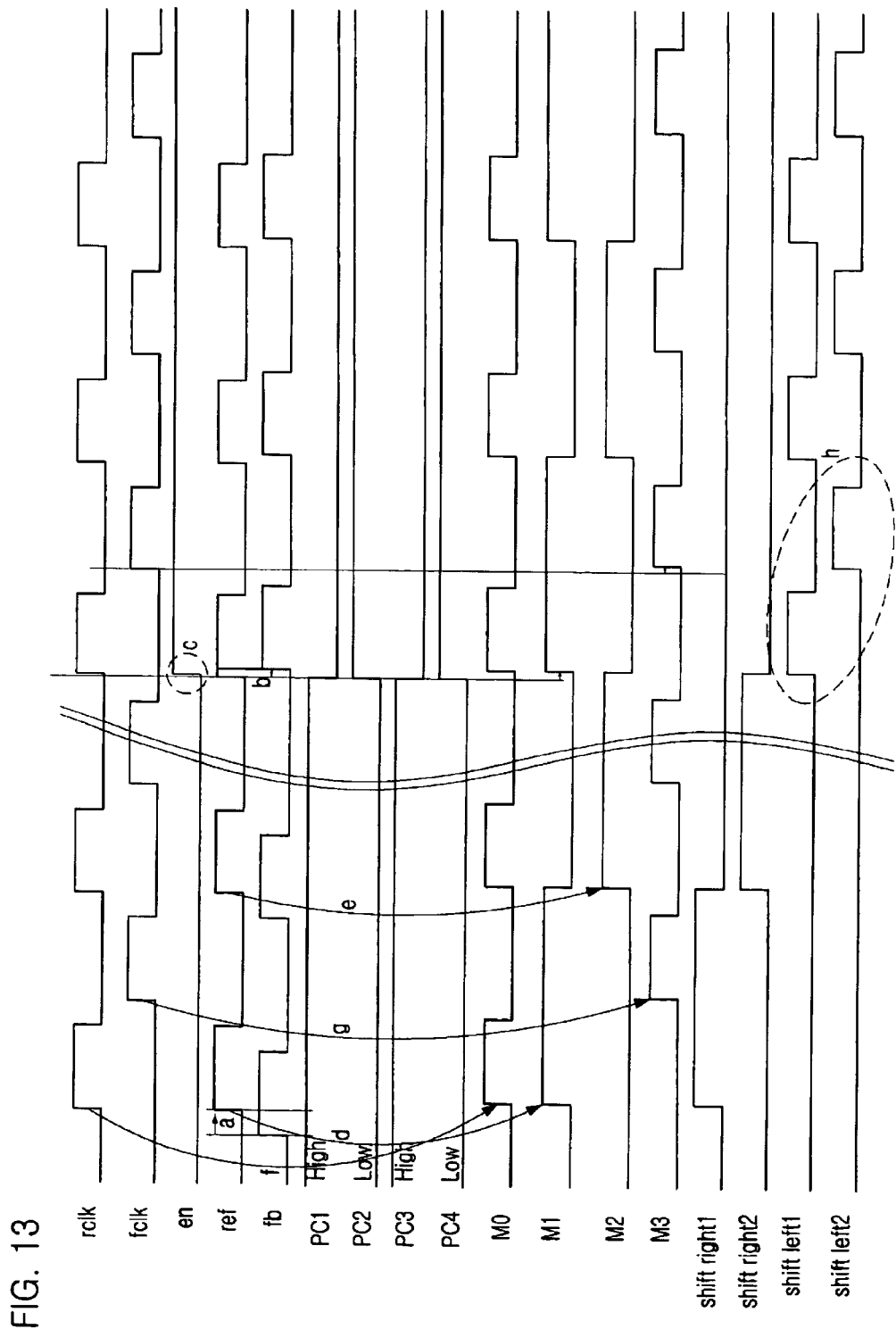
FIG. 13 is a timing chart illustrating an operation of a DLL that performs a 2-bit shifting operation through a phase comparison between a reference clock and a feedback clock.

FIG. 13 is a timing chart illustrating the operation of the DLL that performs the 2-bit shifting operation through the phase comparison between the reference clock and the feedback clock.

Hereinafter, a detailed operation of the DLL will be described with reference to FIGS. 11 and 13.

After the phase between the reference clock ref and the feedback clock fb is locked, if the power is fluctuated so that the phase of the feedback clock fb becomes the lag state like "a", both "PC1" and "PC3" become high states in order to compensate it.

If the power noise is changed to an inverse level after the lag state is maintained through N or more comparisons, the phases of the reference clock ref and the feedback clock fb become reverse like "b" (, i.e., the lead (PC2 and PC 4 of high states)).

If the multi-delay enable signal en is inactivated to a low state, the signals shift right1 and shift right2 are outputted by M1 and M2 that operate in synchronization with the rising edges of the reference clock ref like "d" and "e", so that the shifting operation is performed by unit-delay unit.

In this state, if the multi-delay enable signal en is activated to a high state like "c", the shifting operation is performed like "f" and "g" using the clocks of M0 and M3 that operate in synchronization with the rising clock rclk and the falling clock fclk by 2-bit shifting.

Accordingly, if the signals shift left1 and shift left2 are successively activated during one period of the rising clock rclk or the falling clock fclk like "h", 2-bit shifting operation is performed.

The clocks M0 to M3 are selectively outputted through the respective transmission gates TX111 to TX114 according to the multi-delay enable signal en. The clocks M1 and M2 are clocks obtained by driving the unit-delay control unit 851, which is provided with T-flip flop, using the rising clock rclk. On the other hand, the clocks M0 and M3 are clocks delayed through the delay chains 852_1 and 852_2 having the delay corresponding to the delay of the T-flip flop by using the rising clock rclk and the falling clock fclk, not passing T-flip flop.

After the digital DLL according to the present invention detects the maximum jitter timing, the corresponding delay amount of the delay line is adjusted, thereby preventing the occurrence of the maximum jitter.

Meanwhile, the structure according to the present invention can be implemented using the control method of the digital DLL, which will be described later.

In other words, the phase of the reference clock is compared with that of the feedback clock outputted from the delay model and the maximum jitter timing is detected according to the result of the phase comparison. Then, the delay amount of the delay line is adjusted by multi-delay unit according to the detected timing.

In the detection of the maximum jitter timing, as the result of the phase comparison, a timing when one of the lag or lead states is maintained during at least N-bit operation and then changed is considered as the maximum jitter timing. As the result of the phase comparison, if one of the lag and lead states is not maintained until the N bits, the delay amount of the delay line is adjusted by unit-delay unit.

Although the jitter caused by the noise component having a constant period is described as an example, the present invention can be applied to a jitter component caused by a noise having no constant period.

Further, although the RC DLL among the digital DLLs is described as an embodiment of the present invention, the present invention can be also applied to a hybrid DLL, an SM DLL or an MC DLL.

As described above, the present invention can minimize the jitter occurrence, thereby remarkably improving the reliability of the DLL circuit.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A digital delay locked loop (DLL) comprising:
   a clock generating means for generating a source clock and a reference clock;
   a delay line provided with a plurality of unit delays, for delaying the source clock by a predetermined time;
   a delay model for reflecting a delay time of an actual integral circuit to an output of the delay line;
   a phase comparing means for comparing a phase of the reference clock with a phase of a feedback clock outputted from the delay model;
   a jitter detecting means for detecting a maximum jitter timing in response to a phase comparison signal outputted from the phase comparing means and generating a multi-delay enable signal, wherein the jitter detecting means activates the multi-delay enable signal at a timing when the phase comparison signal maintains one of a lag or lead state during N bits and the state is changed; and
   a delay control means for controlling a delay amount of the delay line by unit-delay unit or multi-delay unit in response to the phase comparison signal and the multi-delay enable signal.

2. The digital delay locked loop as recited in claim 1, wherein the delay control means controls the delay amount of the delay line by multi-delay unit in response to the multi-delay enable signal.

3. The digital delay locked loop as recited in claim 2, wherein the jitter detecting means includes:
   a summing unit for logically summing bit values corresponding to the lead or lag state of the phase comparison signal; and
   a N-bit storage unit for storing an output of the summing unit by bit unit, the storing unit providing a recovering signal to the summing unit if the phase comparison signal maintains one of the lead or lag state during N bits, the summing unit providing the multi-delay enable signal to the delay control means in response to the recovering signal at a timing when an output state of the phase comparison means is changed.

4. The digital delay locked loop as recited in claim 3, wherein the summing unit stores the summed phase comparison signal to the storage unit by bit unit and resets the storage unit if the state of the phase comparison signal is changed before N bits.

5. The digital delay locked loop as recited in claim 4, wherein the summing unit includes:
   a summing operation unit for performing a logic operation to the lead and lag states of the phase comparison signal to output the summed phase comparison signal;
   a multi-delay enable signal generating unit for generating the multi-delay enable signal in response to the recovering signal; and
   a reset signal generating unit for receiving the summed phase comparison signal and generating a reset signal for resetting the storage unit.

6. The digital delay locked loop as recited in claim 5, wherein the summing operation unit includes:
   a first D-flip flop configured to receive the lead state of the phase comparison signal;
   a second D-flip flop configured to receive the lag state of the phase comparison signal;
   a first NAND gate for NANDing the lead state of the phase comparison signal and an output of the first D-flip flop;
   a second NAND gate for NANDing the lag state of the phase comparison signal and an output of the second D-flip flop; and
   a third NAND gate for NANDing outputs of the first and second NAND gates to output the summed phase comparison signal.

7. The digital delay locked loop as recited in claim 5, wherein the multi-delay enable signal generating unit includes:
   a transmission gate for transmitting a voltage level of a power supply voltage terminal in response to the recovering signal;
   a first inverter for inverting an output of the transmission gate;
   a second inverter connected to the first inverter to configure a latch; and
   a NOR gate for NORing the summed phase comparison signal and an output of the first inverter to output the multi-delayed enable signal.

8. The digital delay locked loop as recited in claim 5, wherein the reset signal generating unit includes a third inverter for inverting the summed phase comparison signal to output the reset signal.

9. The digital delay locked loop as recited in claim 1, wherein the clock generating means generates the source dock synchronized with an external clock, the source clock including a rising clock synchronized with a rising edge of the external clock and a falling clock synchronized with a falling edge of the external clock, and
   the clock generating means further includes a divider for dividing the rising clock and the falling clock, the reference clock being obtained by dividing the rising clock through the divider.

10. The digital delay locked loop as recited in claim 1, wherein the clock generating means generates the source clock synchronized with an external clock, the source clock including a rising clock synchronized with a rising edge of the external clock and a falling clock synchronized with a falling edge of the external clock, the reference clock being identical to the rising clock.

11. The digital delay locked loop as recited in claim 9 or 10, wherein the delay control means includes:
   a unit-delay control unit for controlling the phase comparison signal by unit-delay unit;
   a multi-delay delay unit for controlling the phase comparison signal by multi-delay unit in response to the rising clock and the falling clock;
   a switching unit for selectively switching on/off the unit-delay control unit and the multi-delay control unit in response to the multi-delay enable signal; and
   a logic operation unit for decoding the phase comparison signal in response to the outputs of the unit-delay control unit and the multi-delay control unit to output a plurality of delay signal.

12. The digital delay locked loop as recited in claim 11, wherein the unit-delay control unit includes a T-flip flop and the multi-delay control unit includes a delay chain for delaying the rising clock and the falling clock to have a delay time corresponding to a delay time of the T-flip flop.

13. The digital delay locked loop as recited in claim 11, wherein the delay control means further includes a delay selecting unit for selecting the delay line in response to the plurality of delay signals.

14. The digital delay locked loop as recited in claim 13, wherein the delay selecting unit includes a shift register or a counter.

15. The digital delay locked loop as recited in claim 1, wherein the jitter detecting means detects a jitter component caused by a noise component having a constant period.

16. The digital delay locked loop as recited in claim 3, wherein the N-bit storage unit includes an N-bit shift register.

17. A method for controlling a digital delay locked loop, comprising the steps of:

comparing a phase of a reference clock with a phase of a feedback clock, the feedback clock being outputted from a delay model;

detecting a maximum jitter timing according to a result of the phase comparison, wherein a timing when one of a lag and lead states is maintained until N bits and the state is then changed is detected as the maximum jitter timing; and controlling a delay amount of a delay line by multi-delay unit according to the detection of the maximum jitter timing.

18. The method as recited in claim 17, wherein in the step of detecting the maximum jitter timing, the delay amount of the delay line is controlled by unit-delay unit if one of a lag and lead states is not maintained until N bits.

19. The method as recited in claim 17, wherein the jitter is caused by a noise component having a constant period.

* * * * *

UNITED STATES PATENT AND TRADEMARK OFFICE
CERTIFICATE OF CORRECTION

PATENT NO. : 6,987,408 B2
APPLICATION NO. : 10/745745
DATED : January 17, 2006
INVENTOR(S) : Kim Page 1 of 1

It is certified that error appears in the above-identified patent and that said Letters Patent is hereby corrected as shown below:

Column 14,
Line 3, delete "dock" insert -- clock --.

Signed and Sealed this

Twentieth Day of June, 2006

JON W. DUDAS
*Director of the United States Patent and Trademark Office*